(12) United States Patent
Kasai et al.

(10) Patent No.: US 9,599,648 B2
(45) Date of Patent: Mar. 21, 2017

(54) CAPACITIVE SENSOR

(71) Applicant: OMRON Corporation, Kyoto (JP)

(72) Inventors: Takashi Kasai, Kusatsu (JP); Inoue Tadashi, Yasu (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 14/367,716

(22) PCT Filed: Nov. 14, 2012

(86) PCT No.: PCT/JP2012/079567
§ 371 (c)(1),
(2) Date: Jun. 20, 2014

(87) PCT Pub. No.: WO2013/114704
PCT Pub. Date: Aug. 8, 2013

(65) Prior Publication Data
US 2015/0293160 A1 Oct. 15, 2015

(30) Foreign Application Priority Data

Jan. 31, 2012 (JP) ................................ 2012-019031

(51) Int. Cl.
*G01H 11/06* (2006.01)
*H04R 19/00* (2006.01)
(Continued)

(52) U.S. Cl.
CPC ...... *G01R 27/2605* (2013.01); *B81C 1/00873* (2013.01); *G01H 11/06* (2013.01);
(Continued)

(58) Field of Classification Search
CPC ............ G01R 27/2605; B81C 1/00873; B81C 1/00158; G01H 11/06; H04R 19/005;
(Continued)

(56) References Cited

U.S. PATENT DOCUMENTS

| | | | | |
|---|---|---|---|---|
| 5,452,268 A | * | 9/1995 | Bernstein | H04R 19/005 367/181 |
| 8,952,468 B2 | * | 2/2015 | Ishimoto | H04R 19/005 257/416 |
| 2002/0067663 A1 | * | 6/2002 | Loeppert | B81B 3/0072 367/181 |
| 2007/0261910 A1 | * | 11/2007 | Kasai | G01H 11/06 181/142 |
| 2010/0002895 A1 | * | 1/2010 | Notake | B81B 3/0051 381/174 |
| 2010/0158279 A1 | * | 6/2010 | Conti | H04R 7/24 381/174 |
| 2010/0158280 A1 | * | 6/2010 | Coronato | B81B 3/0072 381/174 |
| 2010/0175477 A1 | * | 7/2010 | Kasai | G01H 11/06 73/649 |
| 2010/0176821 A1 | * | 7/2010 | Kasai | H04R 19/04 324/660 |
| 2010/0212432 A1 | * | 8/2010 | Kasai | H04R 19/005 73/654 |
| 2010/0284553 A1 | * | 11/2010 | Conti | B81B 7/0061 381/174 |

(Continued)

FOREIGN PATENT DOCUMENTS

| | | |
|---|---|---|
| JP | 2011-239197 A | 11/2011 |
| WO | 02/15636 A2 | 2/2002 |
| WO | WO 2011/148740 | * 12/2011 |

OTHER PUBLICATIONS

International Search Report mailed Dec. 25, 2012 for PCT/JP2012/079567 (4 Pages).

*Primary Examiner* — Helen Kwok
(74) *Attorney, Agent, or Firm* — Nutter McClennen & Fish LLP; John J. Penny, Jr.

(57) ABSTRACT

Diaphragm 33 is provided on a top surface of silicon substrate 32, and plate unit 39 is fixed to the top surface of silicon substrate 32 so as to cover the movable electrode film with a gap. Plate unit 39 is made of an insulating material. Fixed electrode film 40 is formed on a bottom surface of plate unit 39, and diaphragm 33 and fixed electrode film 40 constitute a capacitor. In an area around plate unit 39, a whole outer peripheral edge of the top surface of silicon substrate 32 is exposed from plate unit 39. On the top surface of the substrate 32, insulating sheet 47 made of the insulating material is formed in a part of an area exposed from plate (Continued)

unit 39, and electrode pad 48 electrically connected to diaphragm 33 and electrode pad 49 electrically connected to fixed electrode film 40 are provided on a top surface of insulating sheet 47.

8 Claims, 13 Drawing Sheets

(51) Int. Cl.
*G01R 27/26* (2006.01)
*B81C 1/00* (2006.01)
*H04R 19/04* (2006.01)

(52) U.S. Cl.
CPC .... *H04R 19/005* (2013.01); *B81B 2201/0257* (2013.01); *B81B 2201/0264* (2013.01); *H04R 19/04* (2013.01)

(58) Field of Classification Search
CPC ............ H04R 19/04; B81B 2201/0257; B81B 2201/0264; B81B 3/0072; B81B 3/0051; B81B 3/0035; B81B 3/0018
USPC ......... 73/584, 588, 597, 643, 645, 594, 649; 381/174; 367/181
See application file for complete search history.

(56) References Cited

U.S. PATENT DOCUMENTS

| | | | |
|---|---|---|---|
| 2011/0179876 A1* | 7/2011 | Kasai | H04R 19/04 73/649 |
| 2011/0278683 A1 | 11/2011 | Kasai et al. | |
| 2011/0293126 A1* | 12/2011 | Maekawa | H04R 19/005 381/355 |
| 2014/0286509 A1* | 9/2014 | Sciutti | H04R 19/04 381/174 |

* cited by examiner (PRIOR ART)

(PRIOR ART)

(PRIOR ART)

(A)

(B)

CAPACITIVE SENSOR

TECHNICAL FIELD

The present invention relates to a capacitive sensor, particularly to capacitive sensors such as an acoustic sensor and a pressure sensor.

BACKGROUND ART (Acoustic Sensor of Patent Document 1)

FIG. 1 is a plan view illustrating a structure of an acoustic sensor described in Patent Document 1. FIG. 2 is a sectional view taken on a line X-X in FIG. 1. In acoustic sensor 11, conductive diaphragm 14 (movable electrode film) is provided above a top surface of silicon substrate 13 that back chamber 12 vertically pierces, base unit 15 made of $SiO_2$ is formed on the top surface of silicon substrate 13 so as to surround diaphragm 14, and contact layer 16 thinner than base unit 15 is formed in an area outside base unit 15.

Protective film 17 made of an insulating material (SiN) is formed on the whole top surface of silicon substrate 13. Protective film 17 includes dome 18 that is provided above diaphragm 14 so as to cover diaphragm 14, base coating unit 19 that is provided outside dome 18 while having an inverted V-shape in section, and flat unit 20 that is provided outside base coating unit 19. Fixed electrode film 21 is provided on a bottom surface of dome 18 in an area opposed to diaphragm 14, and a capacitor is constructed with diaphragm 14 and fixed electrode film 21 in order to convert an acoustic vibration into an electric signal. Base coating unit 19 covers base unit 15, and flat unit 20 covers the top surface of contact layer 16. Flat unit 20 covers silicon substrate 13 up to an edge of the top surface of silicon substrate 13.

Electrode pads 22 and 23 are provided on the top surface of flat unit 20, electrode pad 22 is electrically connected to diaphragm 14 through flat unit 20, and electrode pad 23 is electrically connected to fixed electrode film 21. Acoustic hole 24 is made in dome 18 and fixed electrode film 21 in order that the acoustic vibration passes through acoustic hole 24.

(Problem of Laser Dicing Property)

In the case that the acoustic sensor is prepared by a MEMS (Micro Electro Mechanical Systems) technology, the plural acoustic sensors are prepared on one wafer at one time, and the acoustic sensors on the wafer are divided into chips by dicing. At this point, when the dicing is performed by a method of dividing the wafer into the chips with a dicing blade, cooling pure water invades into the acoustic sensor, and troubles such as sticking of the diaphragm are possibly generated. Therefore, laser dicing is used to divide the acoustic sensors into the chips. In the laser dicing, the wafer is scanned with a laser beam along a dicing street (cutting band), and a silicon substrate is modified by the laser beam to form amorphous silicon, thereby dividing the wafer along the dicing street.

However, in the acoustic sensor described in Patent Document 1, because the whole top surface of the silicon substrate is covered with the protective film, the whole chip forming area of the wafer is covered with the protective film when the plural acoustic sensors are prepared on the wafer. For this reason, as illustrated in FIG. 3, in the case that wafer 25 is irradiated with laser beam 26 along the dicing street, wafer 25 is irradiated with laser beam 26 through protective film 17 made of SiN. As a result, a shift of a focal point of laser beam 26 or attenuation of laser beam intensity is generated, and possibly a problem is generated in the laser dicing. It is necessary to slow down a scan speed of laser beam 26 in order to prevent a dicing failure, which degrades throughput during production of the acoustic sensor.

(Problem of Suction Property with Suction Collet)

In the case that each acoustic sensor divided into the chip is mounted on a circuit substrate or a casing, the acoustic sensor is sucked and conveyed with a suction collet (pickup tool). FIG. 5 is a fragmentary plan view illustrating a state in which acoustic sensor 11 is sucked with suction collet 27, and FIG. 4 is a sectional view taken on a line Y-Y in FIG. 5. Vacuum suction hole 28 is made at a leading end of suction collet 27. In the case that acoustic sensor 11 is sucked, the leading end of suction collet 27 abuts on the top surface of acoustic sensor 11, and vacuum suction hole 28 is evacuated or brought into a negative pressure to suck acoustic sensor 11.

However, for acoustic sensor 11 in FIGS. 1 and 2, in the case that the leading end of suction collet 27 abuts on the top surface of acoustic sensor 11, the leading end of suction collet 27 abuts on the top surface of base coating unit 19 to generate a gap between vacuum suction hole 28 and flat unit 20 as illustrated in FIGS. 4 and 5. Therefore, air flows into suction collet 27 from vacuum suction hole 28, and acoustic sensor 11 cannot successfully be sucked with suction collet 27. As a result, sometimes acoustic sensor 11 cannot be sucked and lifted with suction collet 27, or sometimes acoustic sensor 11 is dropped during the conveyance.

(Acoustic Sensor of Patent Document 2)

In an acoustic sensor disclosed in Patent Document 2, although the base unit and base coating unit do not exist, the flat unit located outside the dome does not have an area wide enough to be sucked with the suction collet. In the acoustic sensor of Patent Document 2, the whole top surface of the silicon substrate is covered with the protective film. Therefore, even if the flat unit of the protective film is widened such that the flat unit can be sucked with the suction collet, the surface of the protective film is coarser than the top surface of the silicon substrate, and a suction force is insufficiently obtained.

Additionally, in the acoustic sensor of Patent Document 2, because the whole top surface of the silicon substrate is covered with the protective film, the whole chip forming area of the wafer is covered with the protective film in the case that the plural acoustic sensors are prepared on the wafer at one time. Therefore, in the case that the wafer is scanned with the laser beam along the dicing street by the laser dicing, similarly to the acoustic sensor of Patent Document 1, the shift of the focal point of the laser beam or the attenuation of the laser beam intensity is generated, and the problem is generated in the laser dicing.

PRIOR ART DOCUMENTS

Patent Document

Patent Document 1: Japanese Unexamined Patent Publication No. 2011-239197

Patent Document 2: International Patent Publication No. 2002/015636

SUMMARY OF THE INVENTION

Problems to be Solved by the Invention

The present invention has been devised to solve the problems described above, and an object thereof is to provide a capacitive sensor that can surely perform the vacuum suction with the suction collet, and the laser dicing.

Means for Solving the Problem

In accordance with one aspect of the present invention, a capacitive sensor includes: a substrate; a movable electrode provided above the substrate; a protective film that is fixed to a top surface of the substrate so as to cover the movable electrode with a gap, the protective film being made of an insulating material; and a fixed electrode provided on the protective film at a position opposed to the movable electrode. In the capacitive sensor, the capacitive sensor converts a physical quantity into an electrostatic capacitance between the movable electrode and the fixed electrode, a whole outer peripheral edge of the top surface of the substrate is exposed from the protective film, an insulating sheet made of the insulating material is formed in a part of an area exposed from the protective film in the top surface of the substrate, and at least one of an electrode pad electrically connected to the movable electrode and an electrode pad electrically connected to the fixed electrode is provided on a top surface of the insulating sheet.

In the capacitive sensor of the present invention, because the outer peripheral edge of the top surface of the substrate is exposed from the protective film, the vacuum suction is performed to the exposed portion of the capacitive sensor with the suction collet, which allows the capacitive sensor to surely be held. Additionally, because the vacuum suction is performed to both sides of the protective film (that is, the portion in which the movable electrode is provided) with the suction collet, the capacitive sensor can stably be sucked in a balanced manner, and the capacitive sensor is hardly dropped during the conveyance. In the wafer in which the plural capacitive sensors are prepared, because the substrate (wafer) is exposed at the whole outer peripheral edge of each capacitive sensor, the substrate is scanned with the dicing laser beam such that the dicing laser beam passes only through the exposed portion of the substrate after the plural capacitive sensors are prepared in the wafer, which easily divides the wafer into the chips without the obstruction of the protective film. As a result, the throughput can be improved during the production of the capacitive sensor.

In the capacitive sensor of the present invention, the insulating sheet made of the insulating material is formed in the part of the area exposed from the protective film on the top surface of the substrate, and at least one of the electrode pad electrically connected to the movable electrode and the electrode pad electrically connected to the fixed electrode is provided on the top surface of the insulating sheet. Therefore, the electrode pad can be provided on the top surface of the insulating sheet while insulated from the substrate. Preferably the insulating sheet is made of a material identical to that of the protective film so as to be integral with the protective film. For example, the insulating sheet may be made of silicon nitride (SiN).

In the capacitive sensor of the present invention, preferably an outer peripheral edge of the protective film is fixed to the top surface of the substrate, an area inside the outer peripheral edge of the protective film covers the movable electrode with a space between the area inside the outer peripheral edge of the protective film and the top surface of the substrate, and the area where the top surface of the substrate is exposed reaches a neighborhood at an edge of the area including the space between the protective film and the substrate. Accordingly, because the depth of the exposed portion of the substrate can be widened as much as possible, the area sucked with the suction collet can further be widened.

In the capacitive sensor of the present invention, preferably at least a part of the top surface of the substrate is exposed inward by at least 50 μm from an edge of the substrate. Accordingly, because at least the part of the substrate is exposed inward by at least 50 μm from the edge of the substrate, the area wide enough to be sucked with the suction collet is formed in at least the part of the substrate.

In the capacitive sensor of the present invention, preferably a plurality of beams of the movable electrode are fixed to the top surface of the substrate, the beam extending toward an outer peripheral direction, the protective film includes an overhang that extends toward the outer peripheral direction so as to cover the beam, the edge of the protective film is recessed inward between the overhangs, and the top surface of the substrate is exposed in an area where the protective film is recessed between the overhangs. Accordingly, the depth of the exposed portion of the substrate can be widened as much as possible. Therefore, the area sucked with the suction collet can further be widened.

In the capacitive sensor of the present invention, preferably a thin-film electrode pad is provided in the area where the top surface of the substrate is exposed. Accordingly, the electrode electrically connected to the substrate, for example, a ground electrode pad can be provided. Additionally, because the electrode pad is formed into the thin film, the electrode pad hardly becomes the obstruction when the exposed portion of the capacitive sensor is sucked with the suction collet.

In accordance with another aspect of the present invention, an acoustic sensor includes: a substrate; a movable electrode film provided above the substrate; a protective film that is fixed to a top surface of the substrate so as to cover the movable electrode film with a gap, the protective film being made of an insulating material; and a fixed electrode film provided on the protective film at a position opposed to the movable electrode film. The acoustic sensor converts an acoustic vibration into an electrostatic capacitance between the movable electrode film and the fixed electrode film, a whole outer peripheral edge of the top surface of the substrate is exposed from the protective film, an insulating sheet made of the insulating material is formed in a part of an area exposed from the protective film on the top surface of the substrate, and at least one of an electrode pad electrically connected to the movable electrode and an electrode pad electrically connected to the fixed electrode is provided on a top surface of the insulating sheet.

In the acoustic sensor of the present invention, because the outer peripheral edge of the top surface of the substrate is exposed from the protective film, the vacuum suction is performed to the exposed portion of the acoustic sensor with the suction collet, which allows the acoustic sensor to be surely held. Additionally, because the vacuum suction is performed to both sides of the protective film (that is, the portion in which the movable electrode is provided) with the suction collet, the acoustic sensor can stably be sucked in the balanced manner, and the acoustic sensor is hardly dropped during the conveyance. In the wafer in which the plural acoustic sensors are prepared, because the substrate (wafer) is exposed at the whole outer peripheral edge of each acoustic sensor, the substrate is scanned with the dicing laser beam such that the dicing laser beam passes only through the exposed portion of the substrate after the plural acoustic sensors are prepared in the wafer, which easily divides the wafer into the chips without the obstruction of the protective film. As a result, the throughput can be improved during the production of the acoustic sensor.

In the acoustic sensor of the present invention, the insulating sheet made of the insulating material is formed in the part of the area exposed from the protective film on the top surface of the substrate, and at least one of the electrode pad electrically connected to the movable electrode and the electrode pad electrically connected to the fixed electrode is provided on the top surface of the insulating sheet. Therefore, the electrode pad can be provided on the top surface of the insulating sheet while insulated from the substrate. Preferably the insulating sheet is made of a material identical to that of the protective film so as to be integral with the protective film. For example, the insulating sheet may be made of silicon nitride (SiN).

The means that solves the problems in the present invention has a feature in which the above constituents are properly combined, and many variations of the present invention can be made by the combination of the constituents.

Figure 1:
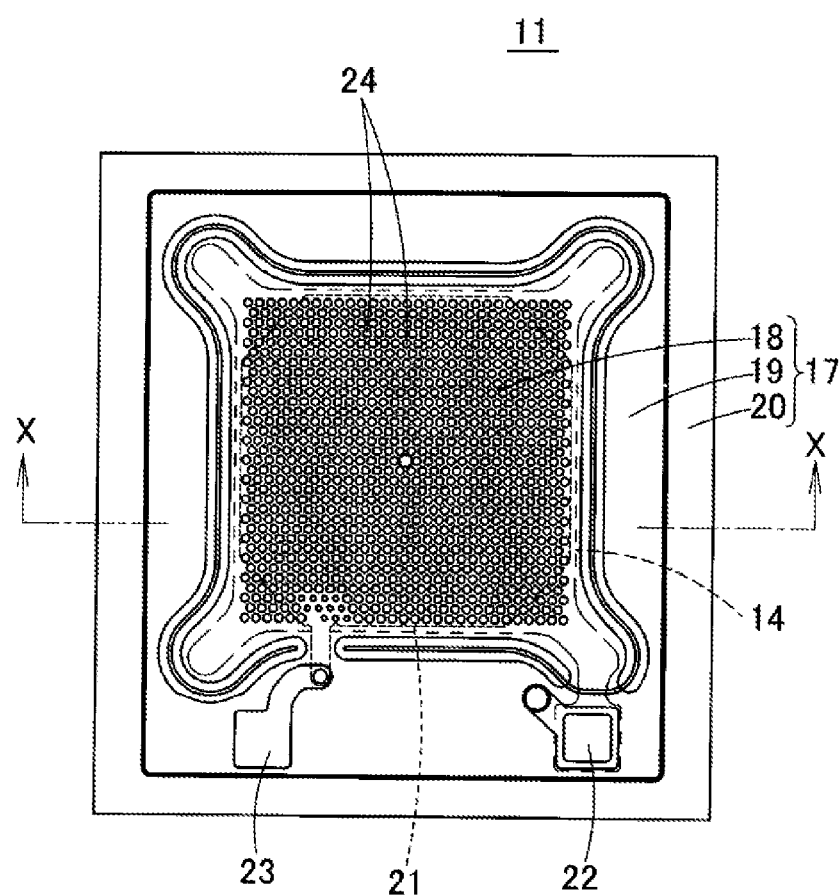
FIG. 1 is a plan view illustrating a conventional acoustic sensor.
Figure 2:
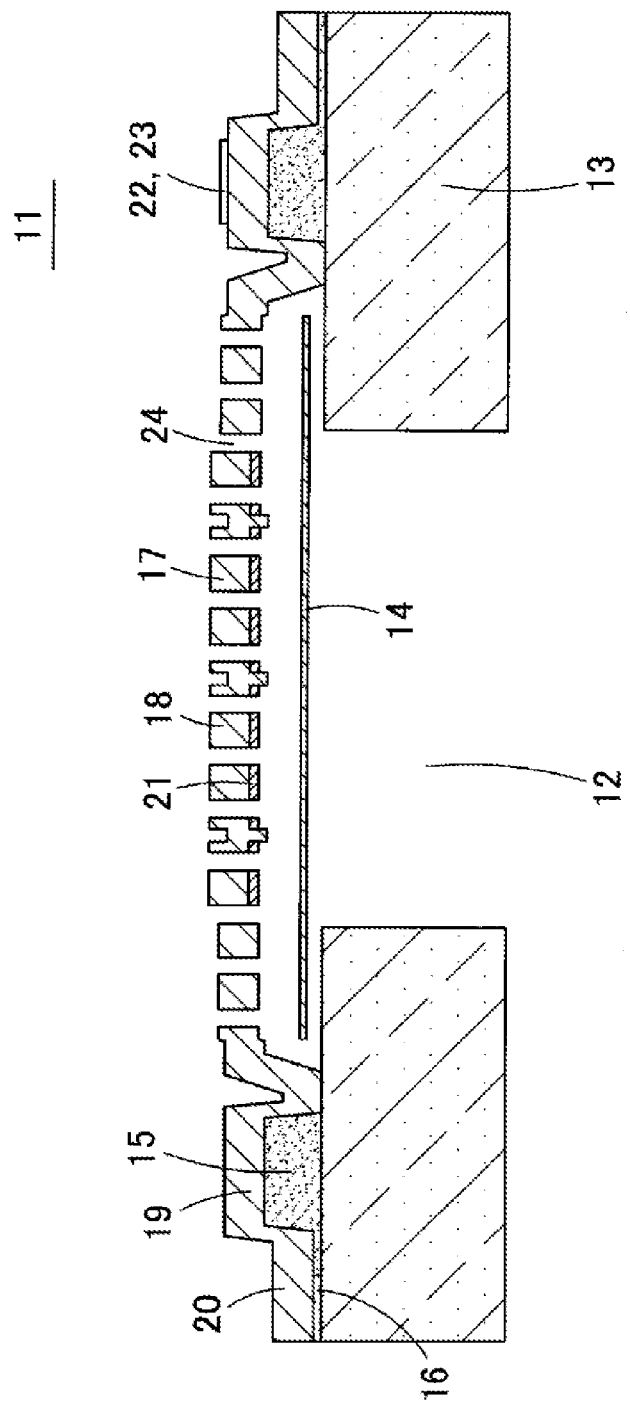
FIG. 2 is a sectional view taken on a line X-X of the acoustic sensor in FIG.
Figure 3:
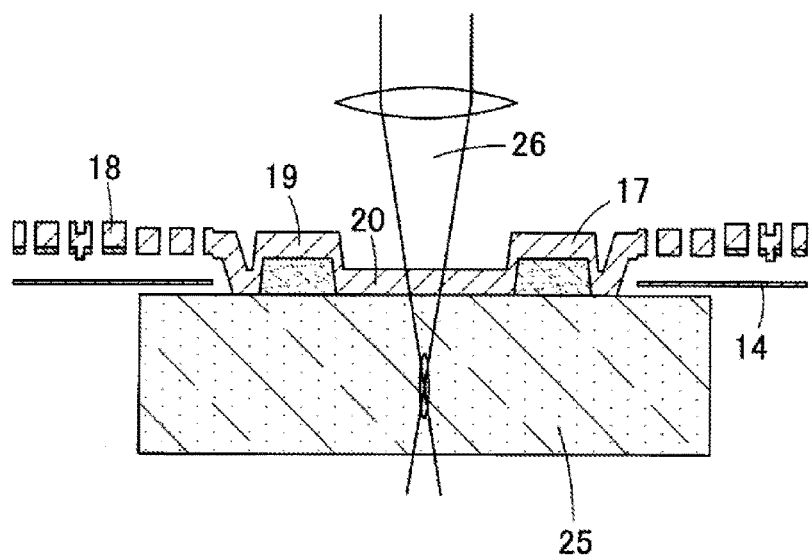
FIG. 3 is a fragmentary sectional view illustrating a process of dividing a wafer into chips by laser dicing to prepare the acoustic sensor in FIG. 1.
Figure 4:
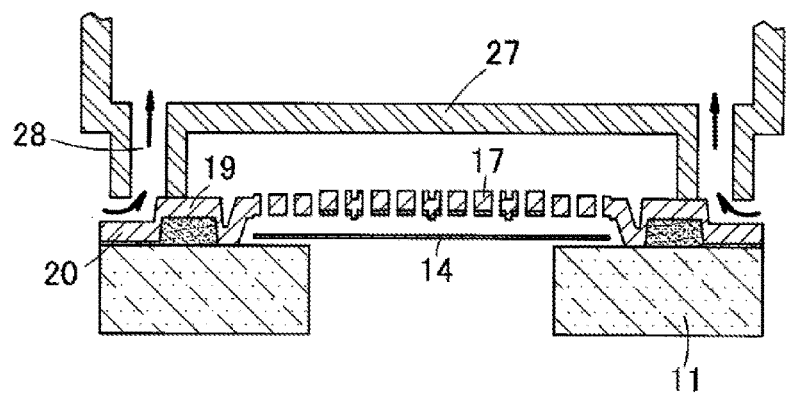
FIG. 4 is a sectional view taken on a line Y-Y in FIG. 5.
Figure 5:
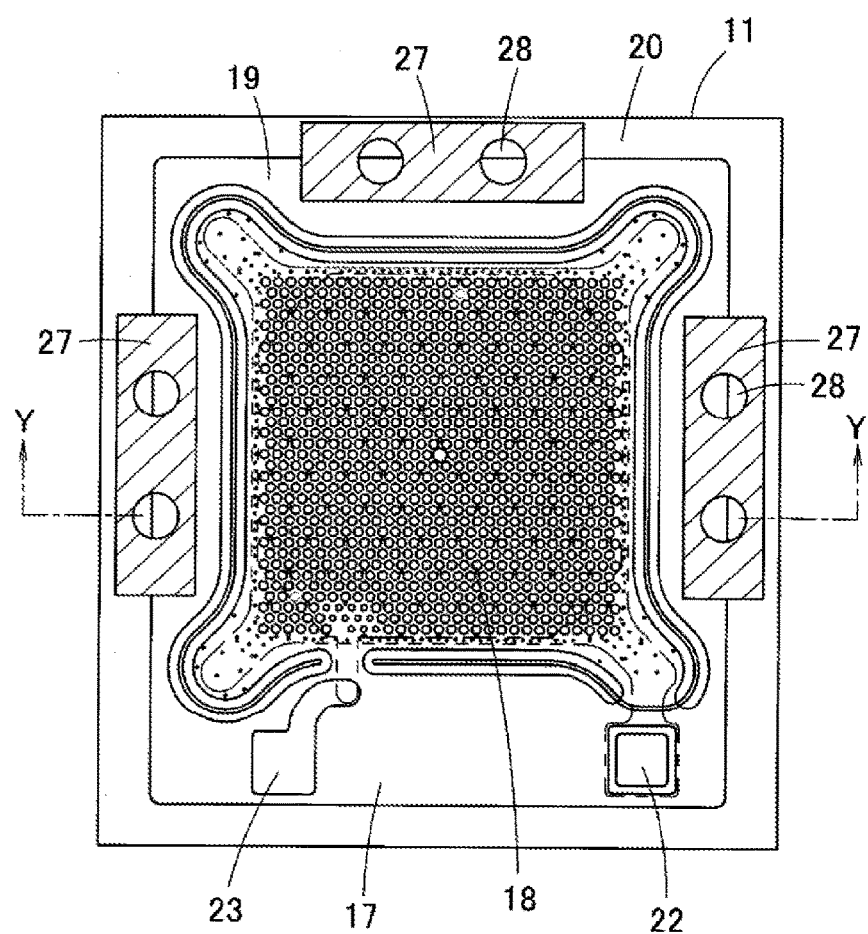
FIG. 5 is a fragmentary plan view illustrating a state in which the acoustic sensor in FIG. 1 is sucked with a suction collet.

DESCRIPTION OF SYMBOLS 31, 71, 72 acoustic sensor
32 silicon substrate
32a wide exposed surface
32b narrow exposed surface
33 diaphragm
34 back plate
39 plate unit
40 fixed electrode film
47 insulating sheet
48, 49, 50 electrode pad
61 wafer
62 laser beam
65 suction collet
66 vacuum suction hole

MODE FOR CARRYING OUT THE INVENTION

Hereinafter, an exemplary embodiment of the present invention will be described with reference to the accompanying drawings. Although an acoustic sensor is described below by way of example, the present invention is not limited to the acoustic sensor. The present invention can be applied to capacitive sensors except the acoustic sensor, particularly to capacitive sensors produced using a MEMS technology. The present invention is not limited to the following embodiments, but various design changes can be made without departing from the scope of the present invention.

(First Embodiment)

Figure 6:
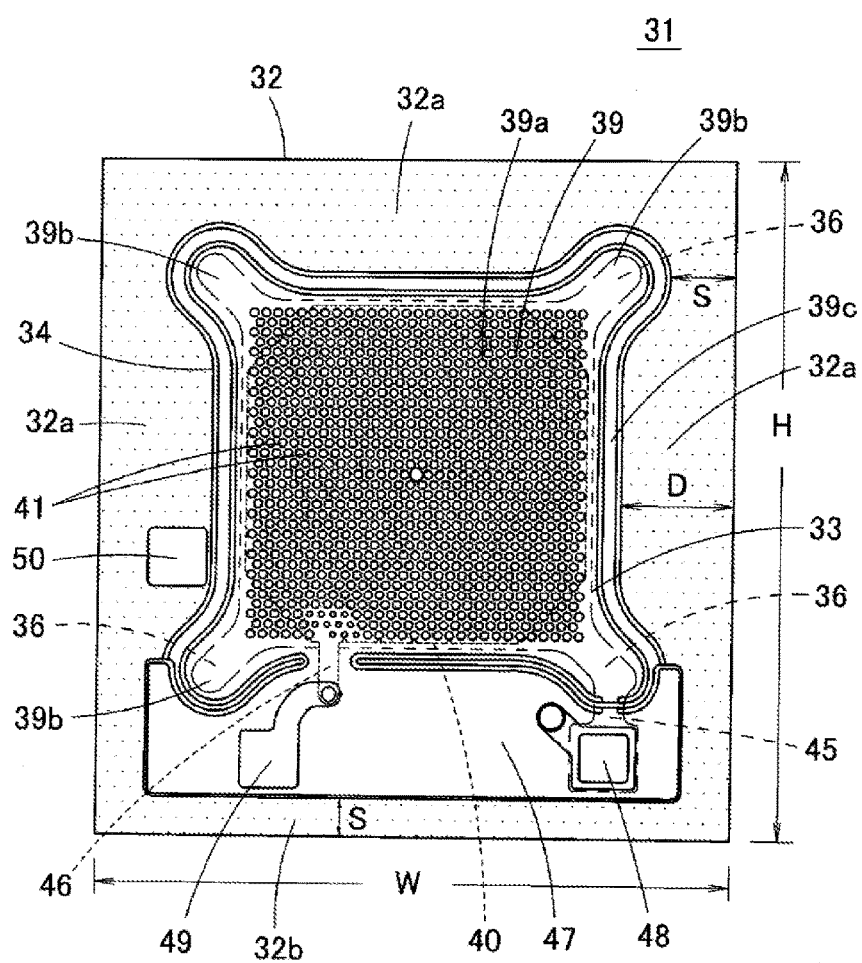
FIG. 6 is a plan view illustrating an acoustic sensor according to a first embodiment of the present invention.
Figure 7:
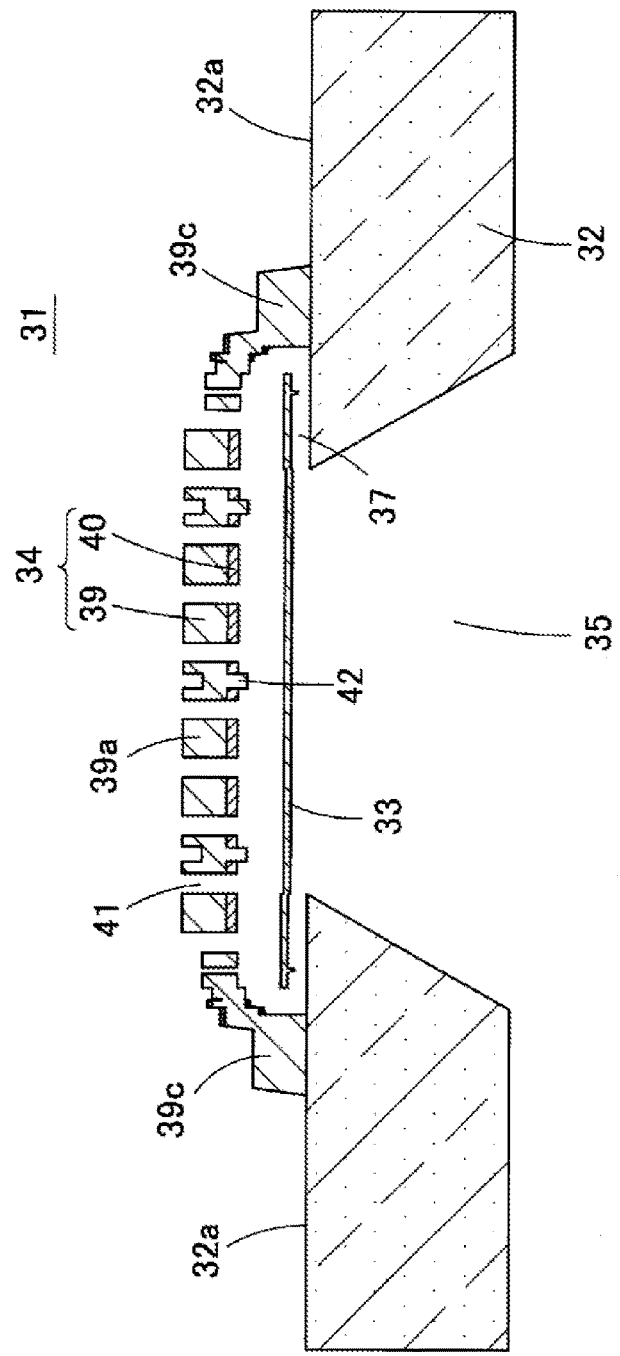
FIG. 7 is a sectional view illustrating the acoustic sensor of the first embodiment in FIG. 6.

A structure of acoustic sensor 31 according to a first embodiment of the present invention will be described with reference to FIGS. 6 and 7. FIG. 6 is a plan view illustrating acoustic sensor 31 of the first embodiment. FIG. 7 is a sectional view of acoustic sensor 31.

Acoustic sensor 31 is a capacitive sensor prepared using the MEMs technology. In acoustic sensor 31, as illustrated in FIG. 7, diaphragm 33 (movable electrode film) is provided on a top surface of silicon substrate 32 (substrate) with an anchor (not illustrated) interposed therebetween, and back plate 34 is provided above diaphragm 33 with a micro air gap (void) interposed therebetween.

Chamber 35 (back chamber or front chamber) is opened in silicon substrate 32 made of single-crystal silicon so as to pierce silicon substrate 32 from a surface to a rear surface. An inner peripheral surface of chamber 35 may be formed into a perpendicular surface or a tapered surface.

Diaphragm 33 is made of a conductive polysilicon thin film having a substantially rectangular shape. Beam 36 extends horizontally toward a diagonal direction from each corner of diaphragm 33 (see FIG. 6). Lead wire 45 having a band-plate shape extends outward from diaphragm 33. Diaphragm 33 is arranged on the top surface of silicon substrate 32 so as to cover the top surface of chamber 35, and a bottom surface of beam 36 is supported by the anchor. Therefore, diaphragm 33 is supported in midair above the top surface of the silicon substrate 32, and narrow ventilation hole 37 is made between an outer periphery in the bottom surface of diaphragm 33 and the top surface of silicon substrate 32 in order to allow an acoustic vibration to pass through narrow ventilation hole 37.

In back plate 34, fixed electrode film 40 made of polysilicon is provided on the bottom surface of plate unit 39 (protective film) made of SiN. Plate unit 39 includes dome 39a, overhang 39b, and outer peripheral edge 39c. As illustrated in FIGS. 6 and 7, dome 39a is formed into a substantially rectangular dome shape. Dome 39a includes a hollow portion in the bottom surface thereof, and the hollow portion covers diaphragm 33. Overhang 39b extends toward the diagonal direction from each of four corners of dome 39a. Overhang 39b covers beam 36 of diaphragm 33 with a void. Outer peripheral edge 39c of plate unit 39 surrounds dome 39a and overhang 39b, and outer peripheral edge 39c is fixed to the top surface of silicon substrate 32. Outer peripheral edge 39c of plate unit 39 has a relatively narrow and substantially uniform width.

When viewed from the top surface of silicon substrate 32, overhang 39b is projected at the corner of plate unit 39, and each side between overhangs 39b is recessed inward. An outer peripheral portion of top surface of silicon substrate 32 is exposed to air (in FIG. 6, an exposed surface of the top surface of silicon substrate 32 is illustrated by a dotted pattern), and constitutes wide exposed surface 32a having a relatively large area on outsides of the three sides of plate unit 39. In the three sides of plate unit 39 adjacent to wide exposed surface 32a, the area where the top surface of silicon substrate 32 is exposed reaches a neighborhood of an edge of the area (dome 39a and overhang 39b) floating from silicon substrate 32 of plate unit 39.

In the remaining direction of plate unit 39, insulating sheet 47 extends so as to be integral with plate unit 39. Insulating sheet 47 is made of the same material (SiN) as plate unit 39. When insulating sheet 47 is integrally formed using the same material as plate unit 39, productivity of acoustic sensor 31 is improved. In the area where insulating sheet 47 is provided, the outer peripheral edge of the top surface of silicon substrate 32 is exposed outside insulating sheet 47 to constitute narrow exposed surface 32b.

The micro air gap (void) is formed between the bottom surface (that is, the bottom surface of fixed electrode film 40) of back plate 34 and the top surface of diaphragm 33. Fixed electrode film 40 and diaphragm 33 are opposed to each other, and constitute a capacitor that detects the acoustic vibration and converts the acoustic vibration into an electric signal. Lead wire 46 extends from the edge of fixed electrode film 40.

Many acoustic holes 41 through which the acoustic vibrations pass are made in the substantially whole back plate 34 so as to pierce back plate 34 from the top surface to the bottom surface. As illustrated in FIG. 6, acoustic holes 41 are regularly arrayed. In the example of FIG. 6, acoustic holes 41 are arrayed into a triangular shape along three directions at 120 degrees to each other. Alternatively, acoustic holes 41 may be arrayed into a rectangular shape or a concentric shape.

As illustrated in FIG. 7, two kinds of micro stoppers 42 (projections) having columnar shapes project from the bottom surface of back plate 34. Stoppers 42 are provided in order to prevent diaphragm 33 from sticking to back plate 34. Stopper 42 projects integrally from the bottom surface of plate unit 39, and projects to the bottom surface of back plate 34 through fixed electrode film 40. Because stopper 42 is made of SiN like plate unit 39, stopper 42 has an insulating property.

Lead wire 45 of diaphragm 33 extends to the bottom surface of insulating sheet 47 while retaining an insulating state from silicon substrate 32, and lead wire 45 is electrically connected to electrode pad 48 provided in the top surface of insulating sheet 47. Electrode pad 48 electrically connected to diaphragm 33 is electrically connected to silicon substrate 32 by a through-hole vertically piercing insulating sheet 47, thereby completely eliminating a parasitic capacitance between electrode pad 48 and silicon substrate 32. Lead wire 46 of fixed electrode film 40 extends to the bottom surface of insulating sheet 47 while retaining the insulating state from silicon substrate 32, and lead wire 46 is electrically connected to electrode pad 49 provided in the top surface of insulating sheet 47. Although electrode pad 49 is insulated from silicon substrate 32, electrode pad 49 is provided in the top surface of insulating sheet 47 while keeping a relatively long distance from silicon substrate 32, so that the parasitic capacitance between electrode pad 49 and silicon substrate 32 can be decreased.

Electrode pad 50 made of a thin metallic film is provided at a proper place in wide exposed surface 32a of silicon substrate 32. Electrode pad 50 is one (for example, ground electrode pad) having a potential equal to that at silicon substrate 32, and electrode pad 50 is electrically connected to silicon substrate 32. When electrode pad 50 electrically connected to silicon substrate 32 is provided while silicon substrate 32 is electrically connected to electrode pad 48, electrode pads 50 and 49 can be used instead of electrode pads 48 and 49 in operating acoustic sensor 31. Therefore, wiring flexibility of a bonding wire is enhanced in mounting acoustic sensor 31.

In acoustic sensor 31, when the acoustic vibration enters the air gap between back plate 34 and diaphragm 33 through acoustic hole 41, diaphragm 33 that is of the thin film vibrates due to the acoustic vibration. An electrostatic capacitance between diaphragm 33 and fixed electrode film 40 changes when diaphragm 33 vibrates to change a gap distance between diaphragm 33 and fixed electrode film 40. As a result, in acoustic sensor 31, the acoustic vibration (change in sound pressure) sensed by diaphragm 33 becomes a change in electrostatic capacitance between diaphragm 33 and fixed electrode film 40, and is output as an electric signal.

Figure 8:
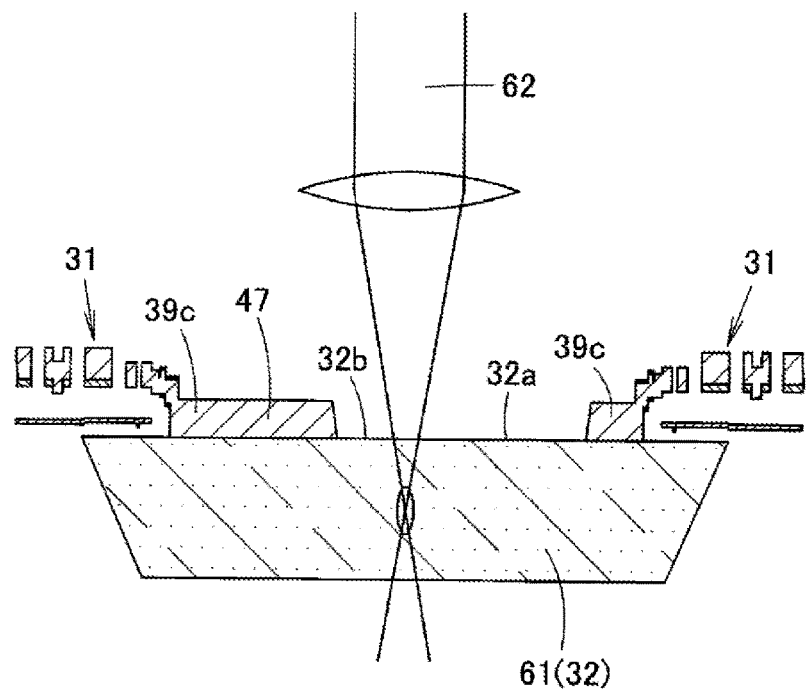
FIG. 8 is a sectional view illustrating a state in which the laser dicing is performed to the acoustic sensor of the first embodiment.

In acoustic sensor 31 of the first embodiment, as described above, the whole outer peripheral edge that becomes a dicing street in dividing the wafer into the chips is exposed on the top surface of silicon substrate 32. For this reason, as illustrated in FIG. 8, laser beam 62 is focused on wafer 61 in which plural acoustic sensors 31 are prepared, and scanned along the dicing street, which allows wafer 61 to be surely diced. That is, back plate 34 or insulating sheet 47 does not exist on the dicing street but the top surface of silicon substrate 32 is exposed. When wafer 61 is divided into the chips by laser dicing, laser beam 62 having high power density can be focused into wafer 61 without a shift of a focal position of laser beam 62 or attenuation of laser beam intensity. Therefore, an amorphous silicon modified layer can surely be formed in wafer 61. Additionally, because a laser irradiation time per place necessary to form the silicon modified layer is shortened, a dicing speed is enhanced while an incidence rate of division defect of acoustic sensor 31 is reduced, and throughput can be improved in producing the acoustic sensor. In the exposed surface, desirably a narrowest width S (see FIG. 6) such as the neighborhood of overhang 39b and narrow exposed surface 32b is greater than or equal to 50 μm in order to surely expose the silicon substrate on the dicing line.

Figure 9:
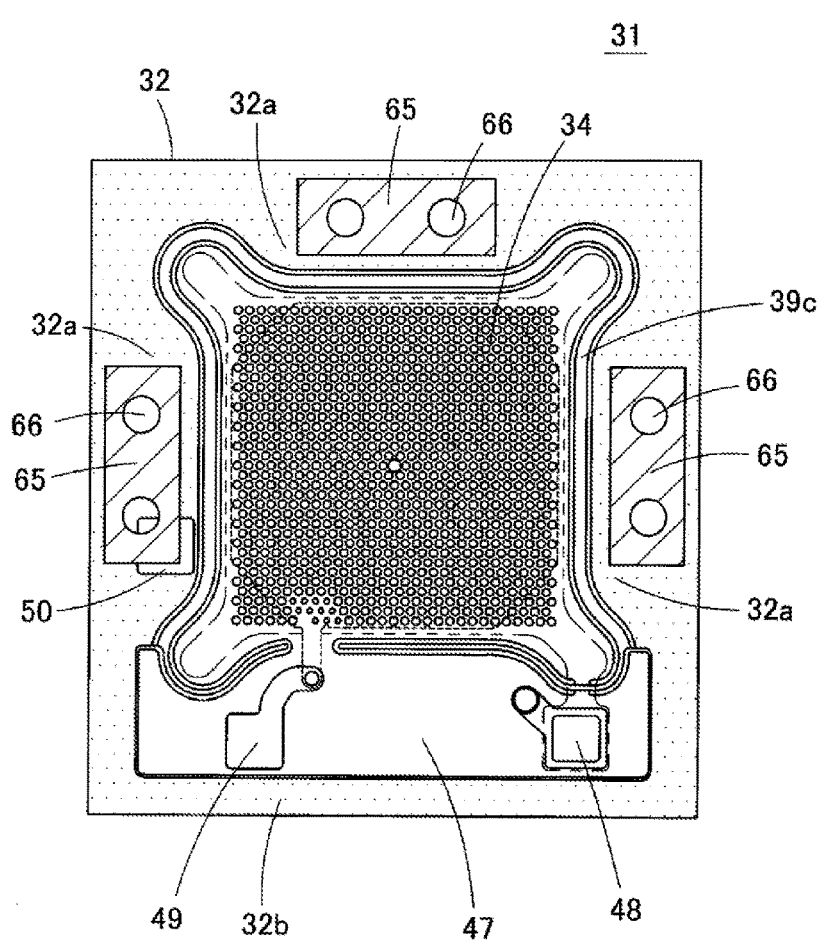
FIG. 9 is a plan view illustrating a state in which the acoustic sensor of the first embodiment is sucked with the suction collet.
Figure 10:
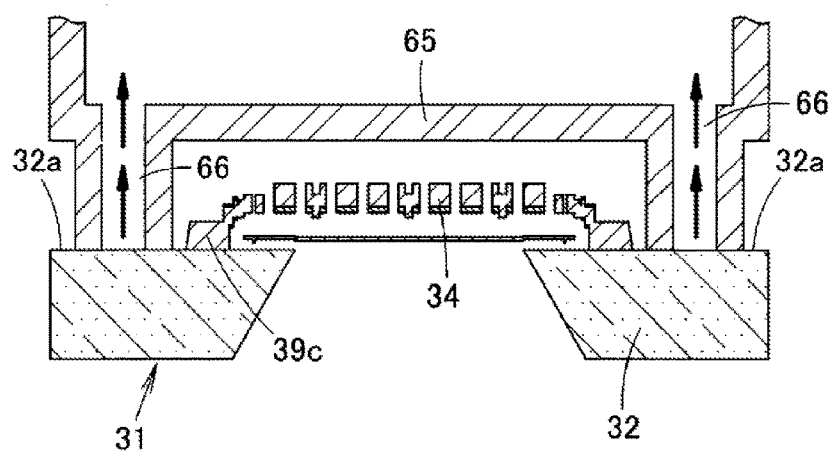
FIG. 10 is a sectional view illustrating a state in which the acoustic sensor is sucked with the suction collet.

Acoustic sensor 31 of the first embodiment includes the area where the top surface of silicon substrate 32 is exposed. Particularly, in the three sides of silicon substrate 32, acoustic sensor 31 includes wide exposed surface 32a that is of a relatively wide exposed surface. Therefore, as illustrated in FIG. 9, acoustic sensor 31 can surely be picked up by sucking two or three places of wide exposed surface 32a using suction collet 65. Because silicon substrate 32 has the smooth top surface, when a leading end of suction collet 65 is pressed against the top surface of silicon substrate 32 as illustrated in FIG. 10, silicon substrate 32 can be correctly sucked by vacuum suction hole 66 at the leading end of suction collet 65 without generating air leakage, and acoustic sensor 31 can surely be picked up. Therefore, accidents such as a failure to lifting acoustic sensor 31 and drop of acoustic sensor 31 during conveyance are hardly generated.

Figure 11:
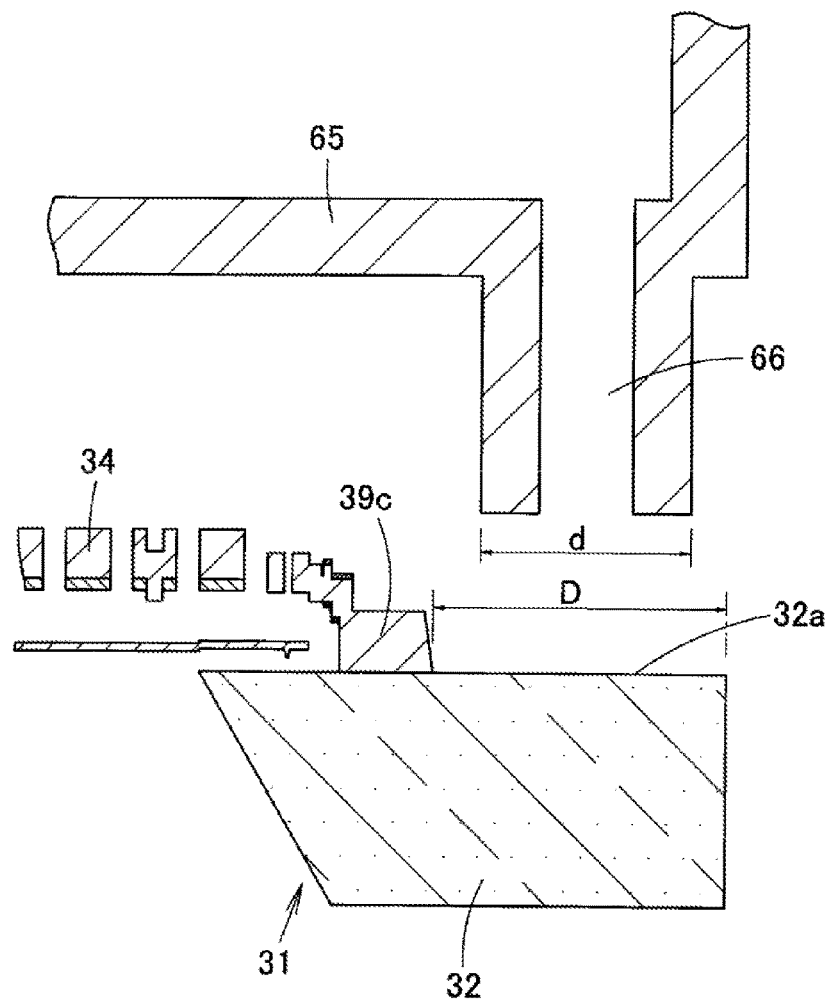
FIG. 11 is a fragmentary sectional view illustrating a relationship between an exposed portion in a top surface of a silicon substrate in the acoustic sensor and the suction collet.

As illustrated in FIG. 11, when depth D of wide is formed wider than exposed surface 32a width d at the leading surface of suction collet 65, the failure to pick up acoustic sensor 31 is further reduced because a position shift of suction collet 65 can be permitted. It is difficult to process the leading end of the suction collet into a micro dimension in order to reduce vacuum suction hole 66 or a thickness, and cost increases. On the other hand, the inexpensive suction collet can be used by sufficiently widening wide exposed surface 32a. For example, in acoustic sensor 31 having a vertical dimension H of 1400 μm and a horizontal dimension W of 1300 μm, desirably depth D of wide exposed surface 32a is greater than or equal to 100 μm. When a sufficiently wide exposed surface of the substrate is provided around back plate 34, although the size of acoustic sensor 31 increases, the area of back plate 34 is reduced as much as possible to be able to restrain the enlargement of acoustic sensor 31.

The structure of acoustic sensor 31 simplifies an appearance shape when viewed from a direction perpendicular to the top surface of silicon substrate 32, so that a process of inspecting the appearance of acoustic sensor 31 is simplified to improve the throughput in the production of acoustic sensor 31. In the case that the whole top surface of silicon substrate 13 is covered with protective film 17 like the conventional example (see FIG. 1), when an image of the top surface of the acoustic sensor is taken with an imaging camera, the change in color runs low in the whole acoustic sensor, or coloring is generated due to interference, which sometimes degrades inspection accuracy. On the other hand, in acoustic sensor 31 of the first embodiment, because the top surface of silicon substrate 32 is substantially exposed except the area where plate unit 39 covers diaphragm 33 and the area where insulating sheet 47 is formed, the area where plate unit 39 and insulating sheet 47 are provided differs from the exposed area of silicon substrate 32 in the color, and the areas are easily distinguished from each other. The generation of the coloring is eliminated in the exposed area of silicon substrate 32, and the suction position of suction collet 65 is easy to recognize.

Figure 12:
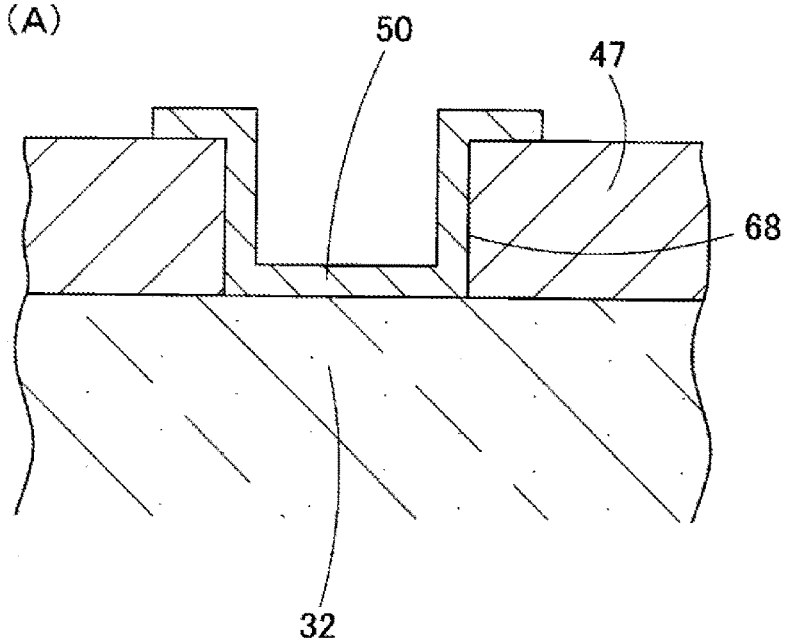
FIG. 12A is a sectional view illustrating an electrode pad prepared in a protective film.
FIG. 12B is a sectional view illustrating a thin-film electrode pad formed in an exposed surface of the silicon substrate.
Figure 12:
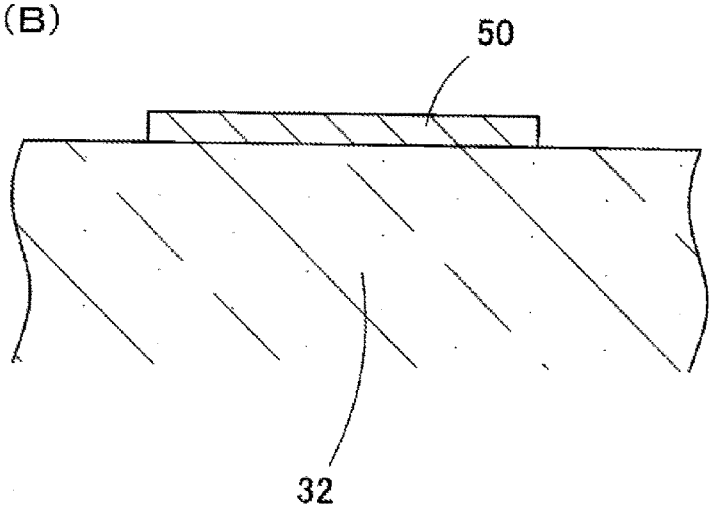

As illustrated in FIG. 12A, in the case that electrode pad 50 is provided at a position of insulating sheet 47, it is necessary that through-hole 68 be made in insulating sheet 47, and that electrode pad 50 be formed so as to come into contact with the top surface of silicon substrate 32 from the top surface of insulating sheet 47 through an inner peripheral surface of through-hole 68. For this structure, adhesion of electrode pad 50 and the top surface of silicon substrate 32 is easily degraded, and possibly electrode pad 50 is peeled off from the top surface of silicon substrate 32. On the other hand, when the thin-film electrode pad 50 is directly formed on the exposed surface of silicon substrate 32 as illustrated in FIG. 12B, the adhesion of electrode pad 50 and the top surface of silicon substrate 32 is enhanced, the peel-off of electrode pad 50 is hardly generated, and the reliability is improved. Additionally, because electrode pad 50 having the same potential as silicon substrate 32 is formed into the thin film, a small amount of air leaks even if the leading end surface of suction collet 65 is placed on electrode pad 50 as illustrated in FIG. 9, the suction failure of suction collet 65 is hardly generated.

In the case that the leading end surface of suction collet 65 is placed on insulating sheet 47 as illustrated in FIG. 12A, a first mask is deposited on the top surface of insulating sheet 47, through-hole 68 is made in insulating sheet 47 by etching through the first mask, and the top surface of silicon substrate 32 is exposed to a bottom of through-hole 68.

Then, the first mask is removed, a second mask is deposited on insulating sheet 47, and electrode pad 50 is formed by depositing a metallic film from the edge of through-hole 68 to the bottom of through-hole 68 through the second mask. Therefore, the plural masks are required ever time the position of electrode pad 50 is changed on insulating sheet 47, or ever time the number of electrode pads 50 is changed. On the other hand, when thin-film electrode pad 50 is formed on the exposed surface of silicon substrate 32 as illustrated in FIG. 12B, the position of electrode pad 50 can be changed only by the preparation of one mask, or the number of electrode pads 50 can be increased only by the preparation of one mask.

(Second Embodiment)

Figure 13:
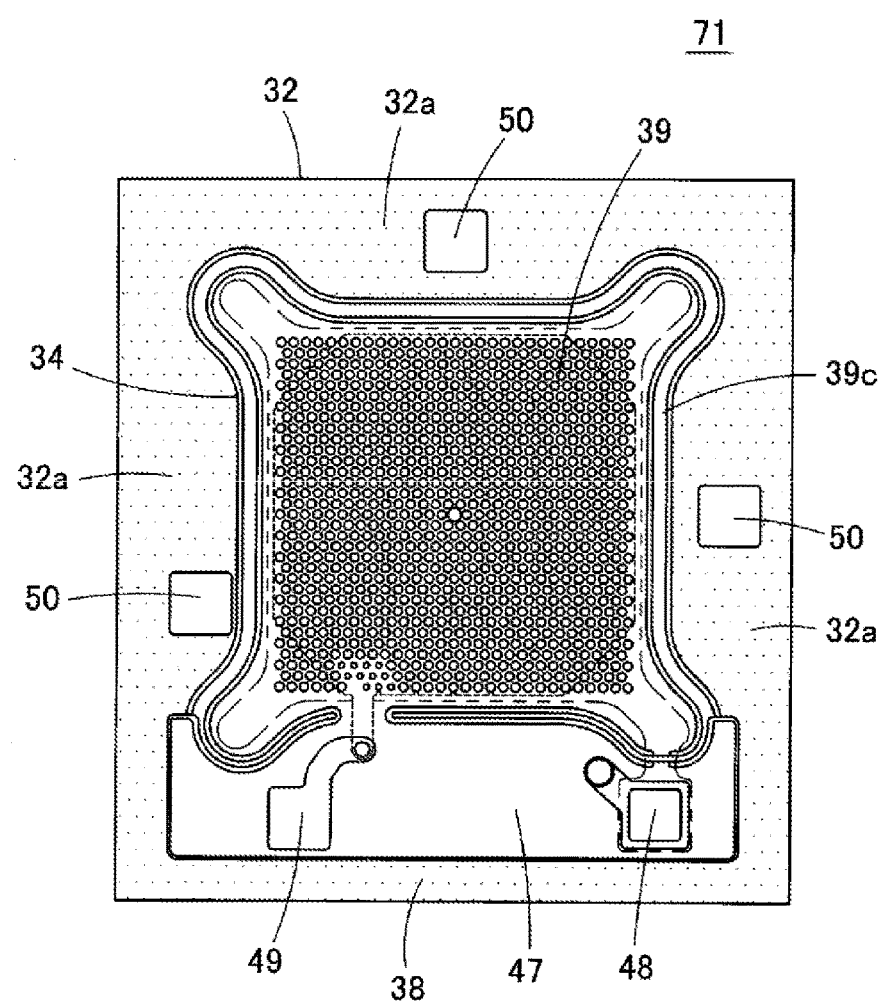
FIG. 13 is a plan view illustrating an acoustic sensor according to a second embodiment of the present invention.

FIG. 13 is a plan view illustrating acoustic sensor 71 according to a second embodiment of the present invention. In the second embodiment, electrode pads 50 are provided on plural wide exposed surface 32a. Particularly, in the example of FIG. 13, electrode pad 50 is provided on each wide exposed surface 32a. Because other structures are similar to those of acoustic sensor 31 of the first embodiment, the description is omitted.

In this embodiment, electrode pads 50 are provided at the positions different from one another. For example, in the case that silicon substrate 32 is grounded, electrode pad 50 to be used is selected from the plural electrode pads 50, and one of electrode pads 50 and a ground line of an external circuit can be connected to each other by a bonding wire, the wiring flexibility of the bonding wire can further be enhanced when acoustic sensor 31 is mounted on a circuit substrate.

(Third Embodiment)

Figure 14:
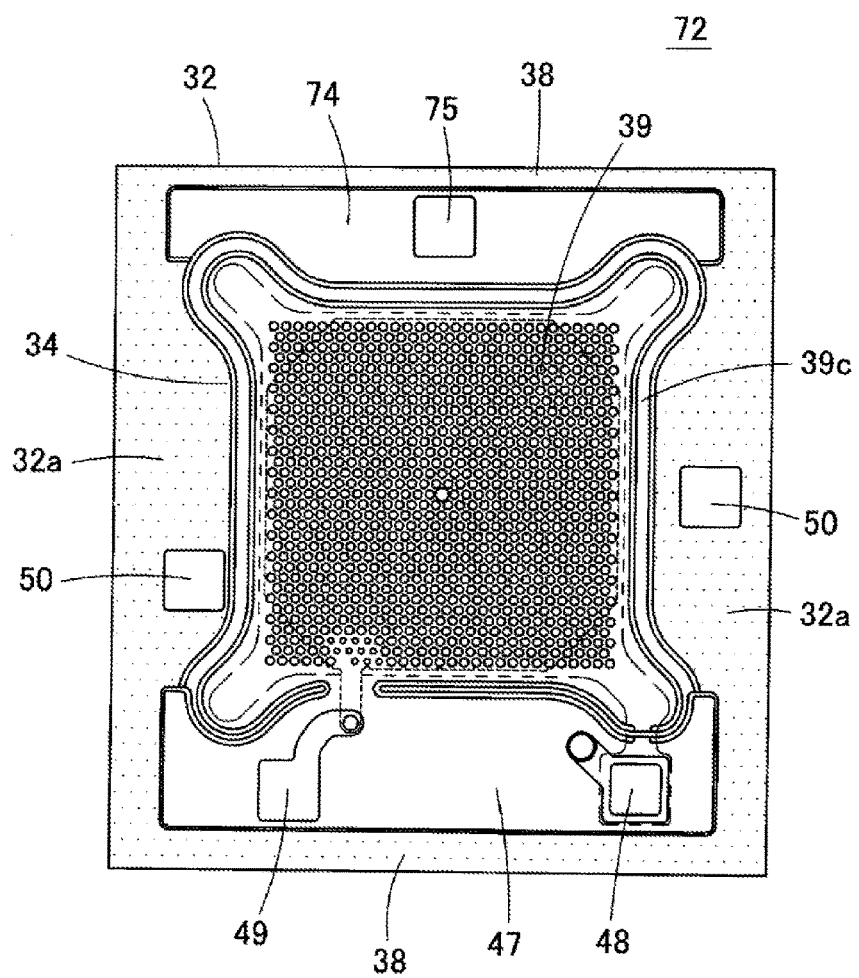
FIG. 14 is a plan view illustrating an acoustic sensor according to a third embodiment of the present invention.

FIG. 14 is a plan view illustrating acoustic sensor 72 according to a third embodiment of the present invention. In the third embodiment, on the side opposite to insulating sheet 47, insulating sheet 74 is also formed on the top surface of silicon substrate 32, and electrode pad 75 is provided on insulating sheet 74. Similarly to insulating sheet 47, desirably insulating sheet 74 is made of the same material as plate unit 39 so as to be integral with plate unit 39. Electrode pad 75 may be one of electrode pad 48 and electrode pad 49, or electrode pad 75 may be electrode pad 50 having the structure in FIG. 12A. Because other structures are similar to those of acoustic sensor 31 of the first embodiment, the description is omitted.

Even if insulating sheets 47 and 74 are provided at two places, acoustic sensor 72 can be sucked with suction collet 65 in a balanced manner because wide exposed surfaces 32a exist in two sides opposed to each other.

The invention claimed is:

1. A capacitive sensor comprising:
   a substrate;
   a movable electrode provided above the substrate;
   a protective film that is fixed to a top surface of the substrate so as to cover the movable electrode with a gap, the protective film being made of an insulating material; and
   a fixed electrode provided on the protective film at a position opposed to the movable electrode,
   wherein the capacitive sensor converts a physical quantity into an electrostatic capacitance between the movable electrode and the fixed electrode,
   a whole outer peripheral edge of the top surface of the substrate is exposed to air and not covered by the protective film,
   an insulating sheet made of the insulating material is formed in a part of an area exposed to air and not covered by the protective film on the top surface of the substrate, wherein the whole outer peripheral edge of the top surface of the substrate exposed to air is disposed outside the insulating sheet, and at least one of an electrode pad electrically connected to the movable electrode and an electrode pad electrically connected to the fixed electrode is provided on a top surface of the insulating sheet.

2. The capacitive sensor according to claim 1, wherein an outer peripheral edge of the protective film is fixed to the top surface of the substrate, an area inside the outer peripheral edge of the protective film covers the movable electrode with a space between the area inside the outer peripheral edge of the protective film and the top surface of the substrate, and the area where the top surface of the substrate is exposed reaches a neighborhood at an edge of the area comprising the space between the protective film and the substrate.

3. The capacitive sensor according to claim 1, wherein at least a part of the top surface of the substrate is exposed inward by at least 50 µm from an edge of the substrate.

4. The capacitive sensor according to claim 1, wherein a plurality of beams of the movable electrode are fixed to the top surface of the substrate, each beam of the plurality of beams extending towards an outer peripheral direction,
the protective film comprises overhangs that extend toward the outer peripheral direction so as to cover each beam of the plurality of beams, an outer peripheral edge of the protective film is recessed inward between the overhangs covering each beam of the plurality of beams, and the top surface of the substrate is exposed in an area where the protective film is recessed between the overhangs covering each beam of the plurality of beams.

5. The capacitive sensor according to claim 1, wherein the insulating sheet is made of a material identical to that of the protective film so as to be integral with the protective film.

6. The capacitive sensor according to claim 5, wherein the insulating sheet is made of silicon nitride.

7. The capacitive sensor according to claim 1, wherein a thin-film electrode pad is provided in the area where the top surface of the substrate is exposed.

8. An acoustic sensor comprising:
a substrate;
a movable electrode film provided above the substrate;
a protective film that is fixed to a top surface of the substrate so as to cover the movable electrode film with a gap, the protective film being made of an insulating material; and
a fixed electrode film provided on the protective film at a position opposed to the movable electrode film,
wherein the acoustic sensor converts an acoustic vibration into an electrostatic capacitance between the movable electrode film and the fixed electrode film,
a whole outer peripheral edge of the top surface of the substrate is exposed to air and not covered by the protective film,
an insulating sheet made of the insulating material is formed in a part of an area exposed to air not covered by the protective film on the top surface of the substrate, wherein the whole outer peripheral edge of the top surface of the substrate exposed to air is disposed outside the insulating sheet, and at least one of an electrode pad electrically connected to the movable electrode and an electrode pad electrically connected to the fixed electrode is provided on a top surface of the insulating sheet.

* * * * *